US006667537B1

(12) United States Patent
Koike et al.

(10) Patent No.: US 6,667,537 B1
(45) Date of Patent: Dec. 23, 2003

(54) SEMICONDUCTOR DEVICES INCLUDING RESISTANCE ELEMENTS AND FUSE ELEMENTS

(75) Inventors: Michio Koike, Sakata (JP); Yuji Oda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/178,873

(22) Filed: Oct. 26, 1998

(30) Foreign Application Priority Data

Oct. 27, 1997 (JP) .......................... P9-294590
Sep. 8, 1998 (JP) ......................... P10-254416

(51) Int. Cl.[7] ............................. H01L 29/00
(52) U.S. Cl. .................. 257/536; 257/379; 257/383; 257/516; 257/529; 257/537; 257/763; 257/764; 257/915
(58) Field of Search ................. 257/536, 537, 257/531–534, 516, 529, 528, 350, 358, 360, 379, 383, 489, 754, 757, 763, 764, 777, 904, 915

(56) References Cited

U.S. PATENT DOCUMENTS

| | | | | |
|---|---|---|---|---|
| 4,455,194 A | * | 6/1984 | Yabu et al. .................. 156/653 |
| 4,533,935 A | * | 8/1985 | Mochizuki .................... 357/51 |
| 4,609,568 A | * | 9/1986 | Koh et al. .................... 427/85 |
| 4,638,400 A | | 1/1987 | Brown et al. ................ 361/304 |
| 4,743,953 A | | 5/1988 | Toyokura et al. ........... 357/23.6 |
| 5,029,127 A | | 7/1991 | Uchida et al. ................ 365/63 |
| 5,053,917 A | * | 10/1991 | Miyasak et al. ............. 361/321 |
| 5,187,557 A | | 2/1993 | Zenke ......................... 257/310 |
| 5,262,662 A | | 11/1993 | Gonzalez et al. ............ 257/307 |
| 5,332,627 A | * | 7/1994 | Watanabe et al. ............ 428/426 |
| 5,352,623 A | | 10/1994 | Kamiyama .................... 437/52 |
| 5,378,660 A | * | 1/1995 | Ngan et al. .................. 437/247 |
| 5,475,248 A | | 12/1995 | Takenaka ..................... 257/295 |
| 5,479,316 A | | 12/1995 | Smrtic et al. ................ 361/322 |
| 5,701,025 A | | 12/1997 | Yoshimori .................... 257/379 |
| 5,804,470 A | * | 9/1998 | Wollesen ..................... 438/141 |
| 5,870,121 A | * | 2/1999 | Chan ............................ 347/59 |

FOREIGN PATENT DOCUMENTS

| | | | | |
|---|---|---|---|---|
| JP | 57056958 A | * | 4/1982 | .......... H01L/27/04 |
| JP | 59227153 A | * | 12/1984 | .......... H01L/27/01 |
| JP | 60-194540 A | * | 10/1985 | .......... H01L/21/82 |
| JP | 63-1054 A | * | 1/1988 | .......... H01L/27/10 |
| JP | 63-160265 | | 7/1988 | |
| JP | 01161745 A | * | 6/1989 | .......... H01L/23/56 |
| JP | 02090668 A | * | 3/1990 | .......... H01L/27/04 |
| JP | 405067792 A | | 3/1993 | ......... H01L/29/788 |
| JP | 406029484 A | | 2/1994 | ......... H01L/27/108 |
| JP | 409162367 A | | 6/1997 | ......... H01L/27/108 |

OTHER PUBLICATIONS

English Abstract for JP3276755, which was previously submitted without an English Abstract in an IDS dated Jun. 9, 1999.

U.S. application Ser. No. 09/178,875, filed Oct. 26, 1998.

* cited by examiner

Primary Examiner—Eddie Lee
Assistant Examiner—Matthew E. Warren
(74) Attorney, Agent, or Firm—Konrad Raynes Victor & Mann, LLP; Alan S. Raynes

(57) ABSTRACT

A semiconductor device may have an insulating layer comprising a silicon oxide film or the like formed so as to cover an entire upper surface of a semiconductor substrate. A resistance element comprising $MoSi_x$ is formed on the insulating layer. An insulating film is provided on the surface of the semiconductor substrate above the insulating layer. A through-hole is provided in the insulating film located above the resistance element, and an electrode provided above the insulating film is electrically connected to the resistance element through this through-hole.

20 Claims, 12 Drawing Sheets

(1)

10 : Semiconductor device
12 : Semiconductor substrate
14 : Insulating layer
16 : MoSi$_x$ resistance element
22 : Insulating film (2)

(1)

(2)

SEMICONDUCTOR DEVICES INCLUDING RESISTANCE ELEMENTS AND FUSE ELEMENTS

TECHNICAL FIELD

The present invention relates to a semiconductor devices such as an integrated circuit having active and passive elements.

RELATED ART

In a semiconductor device such as an integrated circuit, polysilicon has conventionally been used as a resistance element. More recently, resistance elements comprising a titanium-tungsten alloy, a nickel-chromium alloy, or as disclosed in Japanese Unexamined Patent Publication No. H03-276,755, a high-melting-point metal such as titanium nitride (TiN), have now been employed.

When switching over a redundant circuit for obtaining a prescribed program, adjusting voltage to be imposed on a circuit element, or adjusting frequency of a clock circuit, a fuse element for fusing a circuit by current is used. An aluminum alloy or polysilicon has so far been used for such a fuse element.

SUMMARY

It is an object of embodiments of the present invention to downsize the resistance element.

Another object of embodiments of the present invention is to permit easy fusing of the fuse element in a short period of time.

A further object of embodiments of the present invention is to permit simplification and cost reduction of the manufacturing process.

These and other objects may be accomplished in certain embodiments by providing a semiconductor device including integrated active and passive elements and including a resistance element, where the resistance element is formed from layer of titanium nitride containing oxygen or a layer of $MoSi_x$.

Embodiments may also include a semiconductor device including integrated active and passive elements and including a fuse element, where the fuse element is formed from a layer of titanium nitride containing oxygen atoms or a layer of $MoSi_x$.

Embodiments may also include methods for manufacturing semiconductor devices. One embodiment includes a method of manufacturing a semiconductor device having integrated active and passive elements, including forming an insulating layer over the surface of a semiconductor substrate and forming a layer of a material selected from the group consisting of titanium nitride containing oxygen, and $MoSi_x$, over the surface of the insulating layer. At least one of a resistance element and a fuse element is formed by processing the layer of a material selected from the group consisting of titanium nitride containing oxygen and $MoSi_x$.

Another embodiment includes a method in which an insulating layer is formed on a semiconductor substrate and two or more conductors selected from the group consisting of gate electrodes and undercoat wirings are formed on an upper part of the insulating layer. A first insulating film is formed over the semiconductor substrate and a first through-hole is formed in said first insulating film over the upper part of the conductors. A film of material selected from the group including titanium nitride containing oxygen, and $MoSi_x$ is formed on an upper part of the first insulating film and at least one of a resistance element or a fuse element extending between a pair of the conductors is formed by processing said film of material. A second insulating film is formed over the semiconductor substrate and a a second through-hole passing through the first insulating film and the second insulating film over an upper part of the conductors is formed. A conducting film is formed over an upper part of the second insulating film and in the second through-hole; and an electrode for the resistance element or the fuse element connected to said conductors is formed by processing the conducting film.

Still another embodiment includes a method in which two or more diffusion layers are formed in a semiconductor substrate and an insulating layer is formed over the substrate. A first through-hole is formed in the insulating layer over an upper part of the diffusion layer and a layer of material selected from the group consisting of titanium nitride containing oxygen, and $MoSi_x$ is formed over an upper part of the insulating layer and in the first through-hole. At least one of a resistance element or a fuse element is formed so as to extend over a pair of the diffusion layers and an insulating film is formed over the semiconductor substrate. A second through-hole is formed passing through the insulating film and the insulating layer over an upper part of the diffusion layer and a conducting film formed over an upper part of the insulating film and in the second through-hole. An electrode is formed for the at least one of a resistance element or a fuse element connected to the diffusion layer.

Yet another embodiment relates to a method for manufacturing a semiconductor device including active and passive elements, including forming an insulating layer over a semiconductor substrate and forming two electrodes comprising a metallic layer at a distance from the insulating layer. A layer of material selected from the group consisting of titanium nitride containing oxygen, and $MoSi_x$, is formed on the insulating layer and at least one of a resistance element and a fuse element is formed by processing the layer of material.

Yet another embodiment relates to a method including forming a layer of material selected from the group consisting of titanium nitride containing oxygen, and $MoSi_x$, over a substrate and forming at least one of a resistance element or a fuse element by processing said layer of material.

Additional embodiments relate to methods for forming semiconductor devices including steps relating to the formation of a titanium nitride film containing oxygen atoms and steps relating to the formation of an $MoSi_x$ film.

BRIEF DESCRIPTION OF THE DRAWINGS

Embodiments of the invention are described with reference to the accompanying drawings which, for illustrative purposes, are schematic and not drawn to scale.

DESCRIPTION OF EMBODIMENTS

Figure 1:
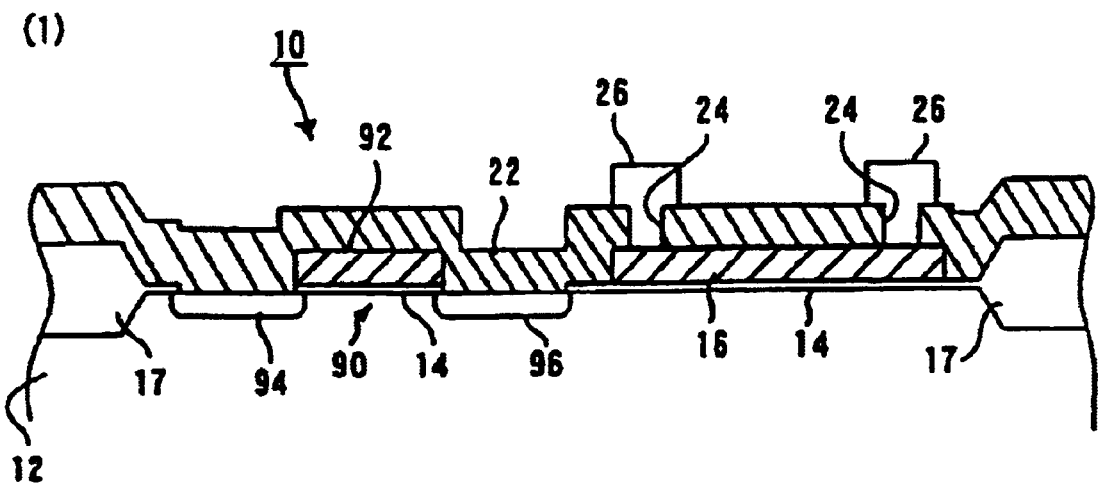
FIG. 1 is a partial descriptive view of a semiconductor device according to a first embodiment of the present invention wherein: (1) is a sectional view of the semiconductor device, and (2) is a plan view illustrating the relationship between a resistance element and an electrode thereof the semiconductor device.
Figure 1:
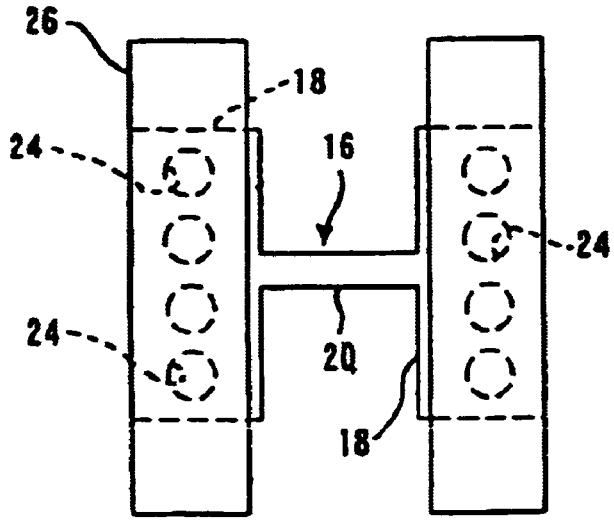

Embodiments of the present invention relate to semiconductor devices and manufacturing methods. Certain preferred embodiments may include devices having a resistance element made from titanium nitride containing oxygen atoms and/or molybdenum silicide ($MoSi_x$).

A resistance element made from a high-melting-point material such as, for example, TiN (without oxygen), has a relatively low specific resistance, and when forming a resistance element having a desired resistance value, the necessity of adopting a larger-sized resistance element has prevented improvement of the degree of integration. For example, using TiN having a relatively high specific resistance, it is necessary to use a considerably long pattern of the resistance element if a sheet resistivity within a range of from several hundred $\Omega/\square$ to several $k\Omega/\square$ is to be achieved for analog purposes, because TiN has a specific resistance of about several hundred $\mu\Omega.cm$. A resistance element made from conventional polysilicon leads to variations of resistance value with the service temperature of the semiconductor device because of a large temperature coefficient of polysilicon. In addition, the resistance element is easily susceptible to the effect of an electric field, resulting in a defect of the resistance value varying under the electric field effect.

A fuse element made from Al or polysilicon requires a large current for breaking a fuse and a time for fusing within a range of from several tens to 100 ms. In order to reduce the fusing current and the fusing time, it is necessary to subject the fuse element to complicated processing steps, which makes it difficult to form the fuse element.

In addition, resistance elements and the fuse elements have typically been formed separately through different processes. This has resulted in a complicated manufacturing process, which prevents cost reduction.

Embodiments of the present invention may include active and passive elements inseparably connected on a semiconductor substrate or in the semiconductor substrate and a resistance element including titanium nitride containing oxygen atoms or $MoSi_x$.

Embodiments of the present invention may have a resistance element comprising titanium nitride containing oxygen or $MoSi_x$, which makes it possible to increase specific resistance, form a resistance element having a prescribed resistance value with a desired size, and downsize the resistance element. More specifically, the specific resistance increases as the atomic weight of oxygen contained in titanium nitride is increased. For example, titanium nitride containing 20 atm. % oxygen leads to a specific resistance about ten times as large as that in the case not containing oxygen. Specific resistance of molybdenum silicide ($MoSi_x$) varies with the amount of silicon (Si). A specific resistance within a range of from about 300 to 2,000 $\mu\Omega.cm$ is available by altering the composition ratio of Mo to Si. It is possible to form a resistance element having a sheet resistivity within a range of from 100 $\Omega/\square$ to several $k\Omega/\square$ in a desired pattern size. Molybdenum silicide is used as a gate electrode material in an MOS-IC, and is easy to handle because of a high affinity with manufacturing. Furthermore, as compared with a resistance using polysilicon, the temperature coefficient can be reduced to about a third, thus leading to smaller variation of the resistance value relative to a change in temperature. As compared with a diffusion resistance, it is possible to form it at an arbitrary position on the semiconductor substrate surface and in any step of manufacture of the semiconductor device. A higher degree of freedom in forming the resistance element is thus available.

Titanium nitride containing oxygen should in certain embodiments preferably have an oxygen atomic weight within a range of from 5 to 25 atomic %. With an oxygen atomic weight smaller than 5 atomic %, the specific resistance may be small enough so that the titanium nitride is not suitable as a resistance material. With an oxygen atomic weight of over 25 atomic %, on the other hand, considerable titanium oxide (TiO) having a high vapor pressure is formed, resulting in a larger quantity of TiO sublimation upon application of a heat treatment. As a result, the resistance value may therefore vary before and after the heat treatment.

Molybdenum silicide ($MoSi_x$) should in certain embodiments have a value of x preferably within a range of from 1.7 to 3.3, or more preferably, $2.0 \leq x \leq 2.5$. A value of x smaller than 1.7 corresponds to a small specific resistance and may not be suitable for forming a resistance element. A value of x of over 3.3 leads not only to a poorer oxidation resistance of $MoSi_x$, but also to more difficult handling in the process. As a result, the specific resistance may vary, depending upon the progress of oxidation.

Figure 13:
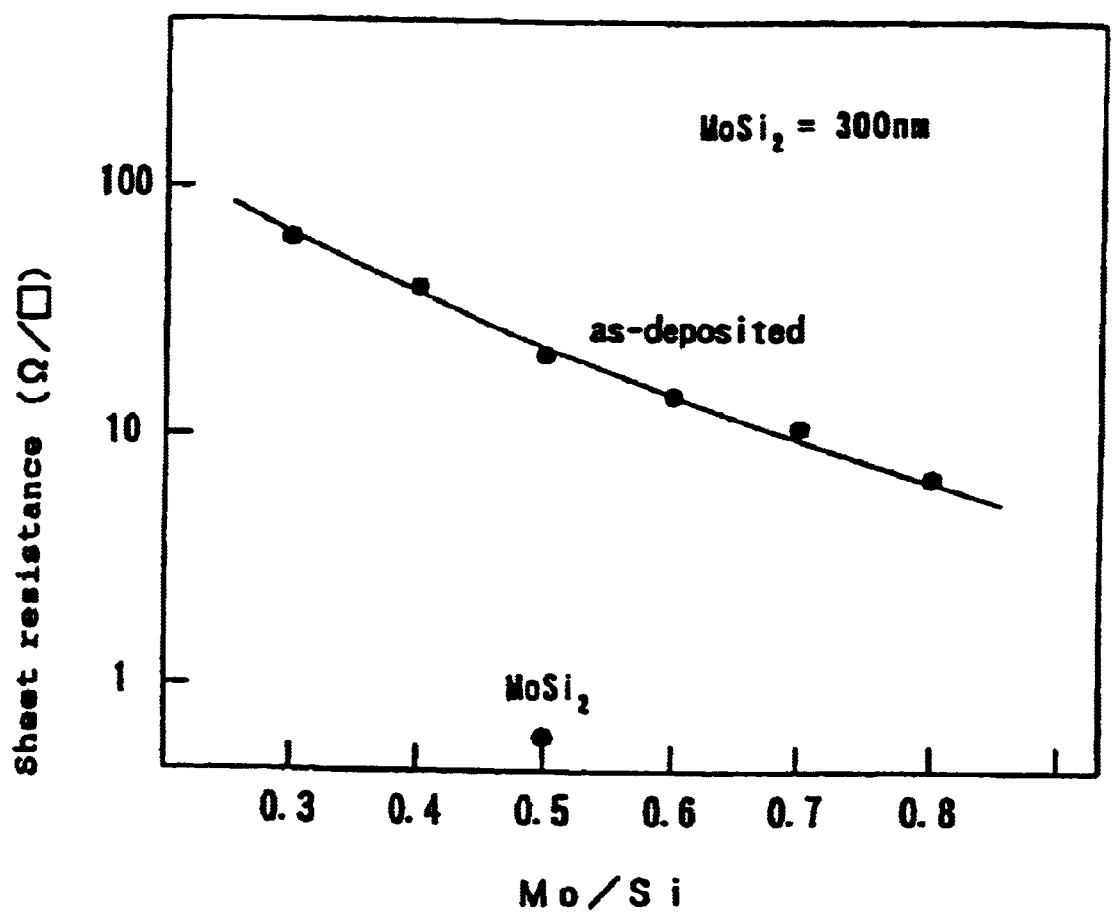
FIG. 13 illustrates the relationship between the composition ratio of Mo to Si in molybdenum silicide and sheet resistivity according to embodiments of the invention.

According to certain embodiments, the thickness of the resistance element may preferably be within a range of from 5 to 100 nm, or more preferably be within a range of from 20 to 60 nm. A thickness smaller than 5 nm makes it difficult to form a uniform film, so that the thin element may be removed upon etching the insulating film, together with the latter. With ease of processing in view, the thickness should preferably be at least 20 $\mu$m. A thickness of over 100 nm leads to a sheet resistivity of under 100 $\Omega/\square$ and is generally not suitable for forming a resistance. According to a study by T. Mochizuki et al., more specifically, molybdenum silicide accumulated by sputtering into a thickness of 300 nm gives a sheet resistivity varying with the amount of Si as shown in FIG. 13 (IEEE. Trans. Electron Device, vol. ed-27, 1980). Particularly with a thickness of under 60 nm, it is possible to form a resistance element having a desired resistance value.

In FIG. 13, the abscissa represents the composition of Mo to Si, illustrating the ratio of Mo relative to Mo (MO/Si). The ordinate represents sheet resistivity ($\Omega/\square$). As is clear from FIG. 13, sheet resistivity is larger according as the amount of Si is larger, leading also to a larger specific resistance. In the case of x=2.3, $MoSi_x$ having a thickness of 300 nm has a sheet resistivity of about 32 $\Omega/\square$. Since sheet resistivity is substantially proportional to thickness, a thickness of 40 nm leads to a sheet resistivity of about 240 $\Omega/\square$.

In certain embodiments the electrode of the resistance element may be formed on the resistance element, or under the resistance element. When the electrode of the resistance element is formed on the resistance element, the electrode can be connected to the resistance element via a hole formed is an insulating film provided on the resistance element.

In certain embodiments the resistance element may be formed by extending over the space between a pair of gate electrodes, or between wires formed by the same process as the gate electrode wiring, or between undercoat wirings. That is, the resistance element electrode may be formed via the insulating film on the gate electrodes of transistor serving as active element, wires formed by the same process as that of the gate electrode wiring, or undercoat wirings. In this case, the electrode of the resistance element is connected, via a hole formed in the insulating film provided so as to cover the gate electrodes, the wires formed by the same process as that of the gate electrode wiring, or the undercoat wirings. Further, the resistance element may be formed so as to extend over a space between a pair of diffusion layers formed on the semiconductor substrate. In this case, the resistance element electrode should preferably be connected, via a hole formed in the insulating film provided so as to cover the diffusion layer, to the diffusion layer.

The semiconductor device of certain embodiments of the present invention may have a configuration including active and passive elements are connected in a semiconductor substrate or on the semiconductor substrate, and the device has a fuse element comprising titanium nitride containing oxygen atoms or $MoSi_x$. Fuse blowout easily occurs with a small current in a short period of time because of a relatively high specific resistance value, thus permitting improvement of the fuse functions.

For substantially the same reason as described above as to the resistance element, titanium nitride containing oxygen atoms forming embodiments of the fuse element should preferably have an oxygen atomic weight within a range of from 5 to 25 atomic %, and $MoSi_x$ forming the fuse element should preferably has a value of x within a range of from 1.7 to 3.0, or more preferably, from 2.0 to 2.5. The resistance element should preferably have a thickness within a range of from 5 to 100 nm, or more preferably, from 20 to 60 nm.

In certain embodiments the fuse element should preferably have a necking portion. By forming a necking portion, blowout can be caused at a certain position of the fuse element, i.e., at the necking portion. An electrode of the fuse element and the fuse element can be formed in the same manner as that for the electrode of the resistance element and the resistance element.

A method for manufacturing a semiconductor device for obtaining the aforementioned semiconductor device according to embodiments of the present invention may include forming an insulating layer over the entire surface of the semiconductor substrate and forming a titanium nitride layer containing oxygen or an $MoSi_x$ layer over the entire surface of the insulating layer. At least one of a resistance element and a fuse element is formed by processing the titanium nitride layer containing oxygen or the $MoSi_x$ layer. By causing the resistance-element and the fuse element to have the same composition, and by forming these elements in a process simultaneously, it is possible to simplify the process and reduce the cost of the semiconductor device.

An electrode of the resistance element or the fuse element can be formed, after forming at least one of the resistance element or the fuse element, by forming an insulating film over the entire surface of the semiconductor substrate and forming a through-hole in the insulating film. A metallic film may be formed so as to cover the insulating film and then processed to form the electrode.

Further, embodiments may include a method for manufacturing a semiconductor device comprising active and passive elements on or in a semiconductor substrate including forming an insulating layer on the semiconductor substrate and forming two or more gate electrodes, wires formed in the same process as the gate electrode wiring, or undercoat wirings on the insulating layer. A first insulating film is formed over the active surface of the semiconductor substrate and a first through-hole is formed in the first insulating film on the gate electrodes, the wire formed by the same process as that of the gate electrode wiring, or the undercoat wirings. A film of titanium nitride containing oxygen or an $MoSi_x$ film is formed on the first insulating film and at least one of a resistance element or a fuse element is formed so as to extend over the pair of gate electrodes or the undercoat wirings by processing the titanium nitride film containing oxygen or the $MoSi_x$ film. A second insulating film is formed over the entire surface of the semiconductor substrate and a second through-hole is formed passing through the first insulating film and the second insulating film on the gate electrodes or the undercoat wirings. A metallic film is formed on the second insulating film and an electrode of the resistance element or the fuse element connected to the gate electrodes, wires formed by the same process as that of the gate electrode wiring, or the undercoat wirings is formed by processing the metallic film.

Embodiments relating to manufacturing methods for embodiments of the invention may also include a semiconductor device comprising active and passive elements and include forming two or more diffusion layers in a semiconductor substrate and forming an insulating layer over the entire surface of the semiconductor substrate. A first through-hole is formed in the insulating layer on the diffusion layer and a titanium nitride layer containing oxygen or an $MoSi_x$ layer is formed on the insulating layer and in the first through-hole. At least one of a resistance element or a fuse element is formed so as to extend over the pair of the diffusion layers by processing the titanium nitride layer containing oxygen or the $MoSi_x$ layer. An insulating film is formed over the entire surface of the semiconductor substrate and a second through-hole is formed passing though the insulating layer and the insulating film on the diffusion layer. A metallic layer is formed on the insulating layer and in the second through-hole and an electrode of the resistance element or the fuse element, connected to the diffusion layer, is formed by processing the metallic film.

The step of forming the titanium nitride layer containing oxygen may comprise a step of forming a TiN layer by sputtering and a step of injecting oxygen ions into the TiN layer formed by sputtering, or may also comprise a step of forming the TiN layer by sputtering and a step of oxidizing the TiN layer formed by sputtering.

Further, the titanium nitride layer containing oxygen atoms may be formed by sputtering with Ti as a target in an atmosphere comprising oxygen gas and nitrogen gas, or after forming the TiN layer by sputtering, by annealing in an atmosphere comprising oxygen gas or nitrogen gas. The MoSi$_x$ layer may be formed by sputtering with MoSi$_x$ having the same composition as that of the MoSi$_x$ layer as a target.

Some preferable embodiments of semiconductor devices and manufacturing methods will be described in detail with reference to the attached drawings.

FIG. 1 is partial description view of a semiconductor device of a first embodiment of the invention wherein: (1) is a sectional view of the semiconductor device, and (2) is a plan view illustrating the relationship between a resistance element and an electrode thereof the semiconductor device.

As shown in FIG. 1(1), a semiconductor device 10 comprises an insulating film 14 serving as a gate oxide film comprising silicon oxide film (SiO$_2$ film) provided on a semiconductor substrate 12 comprising silicon, for example, and a resistance element 16 serving as a passive element formed of MoSi$_x$ formed thereon. Further, a MOS transistor 90 serving as an active element is formed adjacent to the resistance element 16 on the semiconductor substrate 12. The MOS transistor 90 has a gate electrode 92 via an insulating layer (insulating oxide film) 14 on the semiconductor substrate 12, and a source 94 and a drain 96 comprising impurity diffusion layers provided on the both sides of the gate electrode 92.

The resistance element 16 may be formed with titanium nitride containing oxygen. The insulating layer on which the resistance element is provided may comprise a silicon nitride film (SiN film), or may be an element separating film 17 formed with LOCOS or the like provided on the semiconductor substrate surface. When an element is provided under the insulating layer 14, the insulating layer may be a single inter-layer insulating film or a multi-layer inter-layer insulating film.

The resistance element 16 has land portions 18 at the both ends, for example as shown in FIG. 1(2), and a resistance element main body 20 is formed between these land portions in an appropriate pattern such as, for example, a straight line or a zig-zag form. In the semiconductor device 10, an insulating film 22 comprising a silicon oxide film, for example, is provided over the entire surface of the semiconductor substrate 12 covering the resistance element 16 and the insulating layer 14. A plurality of through-holes (contact holes) 24 are provided at positions of the insulating film 22 corresponding to the land portions of the resistance element 16. An electrode 26 of the resistance element, electrically connected via the through-hole 24 to the resistance element 16 is drawn out on the insulating film 22. In this embodiment, the electrode 26 is formed of a metallic film made of aluminum (Al) or an aluminum alloy (for example, an Al—Ca alloy and an Al—Si—Cu alloy), or a combination of a barrier metal such as Ti, TiN or TiW and aluminum or an aluminum alloy (lamination).

The resistance element comprising MoSi$_x$ formed as described above (MoSi$_x$ resistance element) may preferably have a specific resistance within a range of from about 300 to 2,000 $\mu\Omega/\square$.cm by altering the composition ratio of Mo to Si. A resistance element 16 preferably having a sheet resistivity within a range of from 100 $\Omega/\square$ to several k$\Omega/\square$ can easily be formed in a desired pattern. Molybdenum silicide is used as a material for a gate electrode in an MOS-IC, has a high affinity with manufacturing, can be handled easily, and permits easy manufacture. In addition, because temperature coefficient can be reduced to about a third as compared with a resistance using polysilicon, it is possible to reduce variations of the resistance value relative to a change in temperature, and as compared with a diffusion resistance, it can be formed in any arbitrary step in the manufacture of a semiconductor device, thus leading to a higher degree of freedom in forming the resistance element 16.

Figure 2:
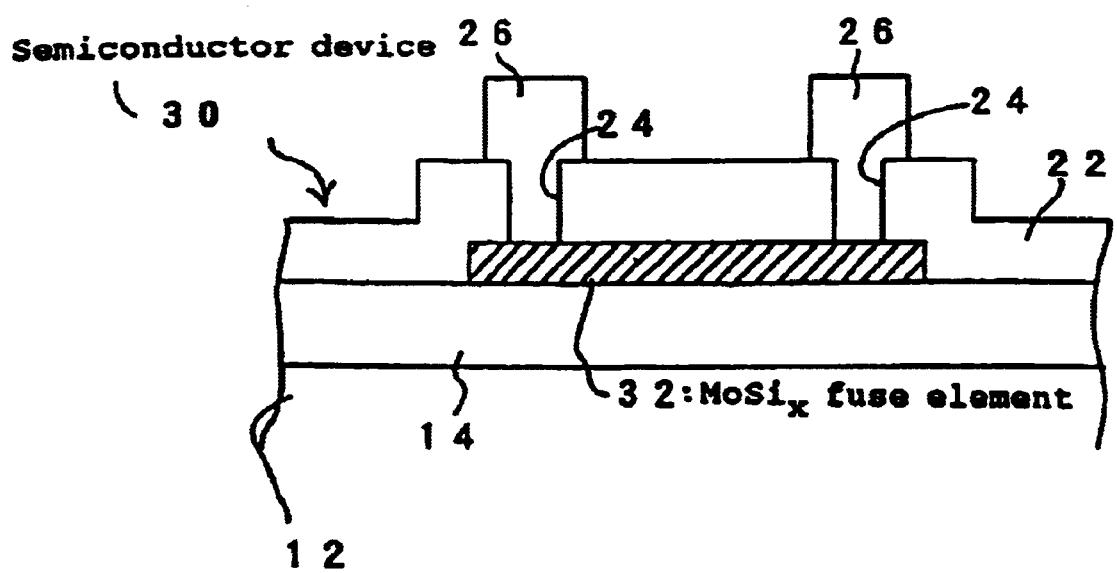
FIG. 2 is a partial descriptive view of a semiconductor device according to a second embodiment of the invention wherein: (1) is a sectional view of the semiconductor device, and (2) is a plan view illustrating the relationship between a fuse element and an electrode thereof of the semiconductor device.
Figure 2:
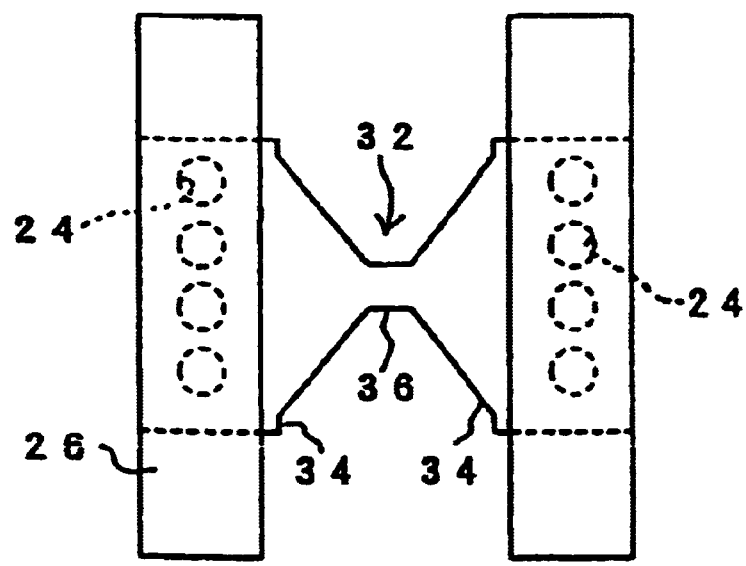

FIG. 2 is a partial descriptive view of a semiconductor device of a second embodiment of the invention wherein: (1) is a sectional view of the semiconductor device, and (2) is a plan view illustrating the relationship between a fuse element and an electrode thereof of the semiconductor device. The semiconductor device 30 of the second embodiment has a fuse element 32 comprising MoSi$_x$ in place of the resistance element 16 in the semiconductor device 30 of the first embodiment, and has basically same configuration as that of the semiconductor device 10 of the first embodiment except the above. The fuse element 32 may be made of titanium nitride containing oxygen atoms as well.

However, the fuse element 32 of this embodiment is formed so that the side opposite to the land portions 34 at the both ends has a width gradually becoming smaller toward the opposite side. A fuse main body 36 having a small width with a making portion is provided at the center between the both land portions 34 so that, when current layer than a prescribed value flows through an electrode 26 to the fuse element 32, the fuse element is blown out without fail at the fuse main body 36.

Figure 3:
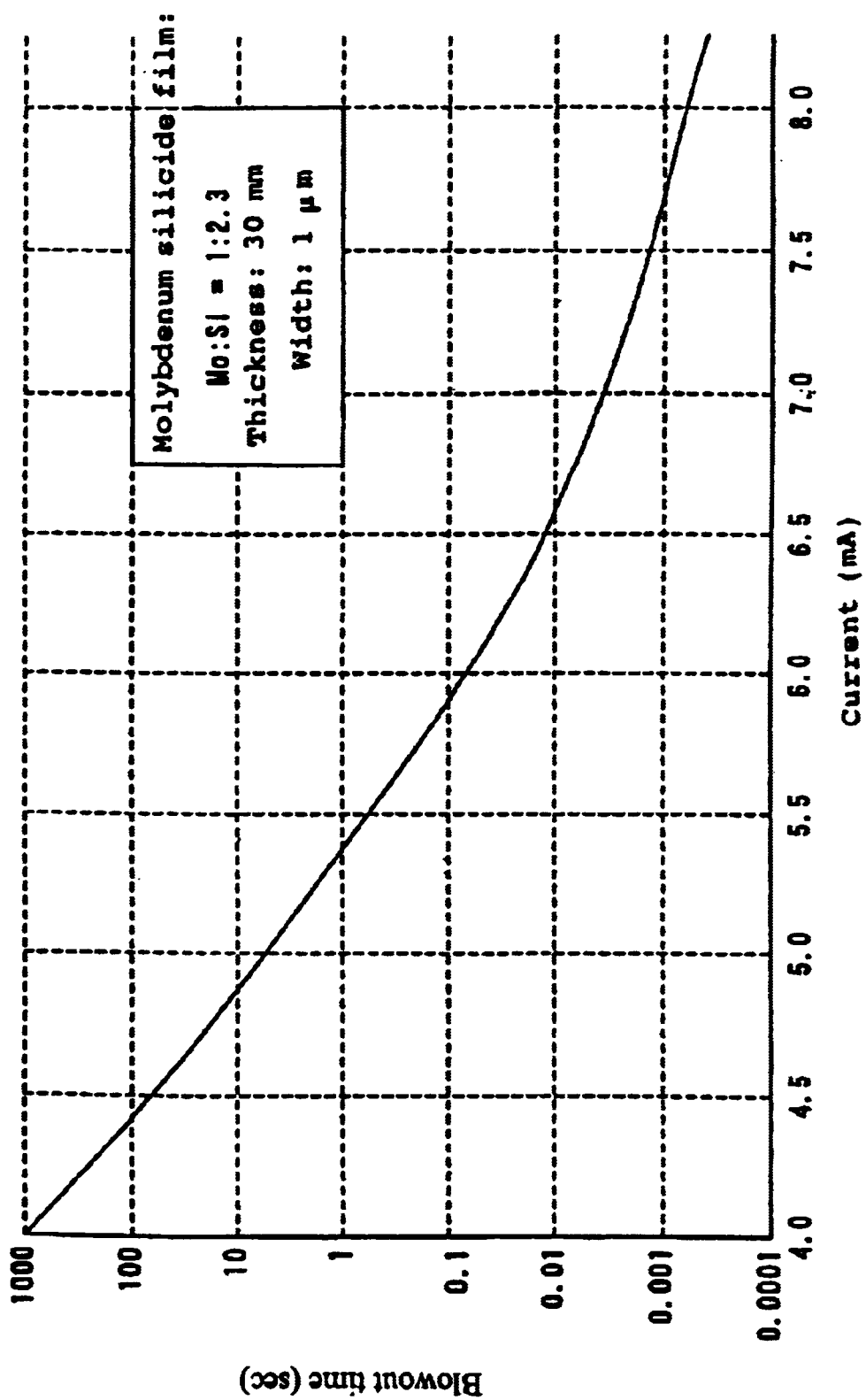
FIG. 3 illustrates the relationship between current flowing through a molybdenum silicide film and the blowout time.

When the fuse element 32 comprising MoSi$_x$ formed as described above has a value of x of 2.3, a thickness of 30 nm and a necking portion 36 width of 1 $\mu$m, the fuse element 32 can be fused in about 10 msec by feeding a current of 10 mA. More specifically, when a molybdenum silicide film having a composition ratio of Mo to Si of 1:2.3 has a thickness of 30 nm and a width of 1 $\mu$m, there is a relationship as shown in FIG. 3 between current fed and the blowout time: the fuse element can be fused in a period of less than 10 msec by feeding a current of about 8 to 10 mA. It is therefore possible to easily cut the fuse element 32 in a short period of time with a small current, thus permitting easy accomplishment of switching of a redundant circuit upon preparing a program, adjustment of voltage of a circuit element, and frequency adjustment of a clock circuit.

FIG. 4 illustrates a third embodiment, and is a process diagram describing a manufacturing method of a semiconductor device 10. First, as shown in FIG. 4(a), an insulation layer 14 comprising a silicon oxide film or a silicon nitride film is formed on the upper surface of a semiconductor substrate 12 into a prescribed thickness (for example, 400 nm) by a CVD process or the like. Then, an MoSi$_x$ film 40 is formed on the entire surface of an insulating layer 14. The MoSi$_x$ film 40 may be formed by DC magnetron sputtering with MoSi$_x$ having the same composition as that of the MoSi$_x$ film 40 as a target.

The composition ratio of Mo to Si should be determined, taking account of processability of the MoSi$_x$ film 40, the level of ease of handling, the specific resistance to be achieved, and the size of resistance element. The target MoSi$_x$ may be one preferably having 1.7$\leq$x$\leq$3.3, and should more preferably have 2.0$\leq$x$\leq$2.5. Molybdenum silicide having a value of x smaller than 1.7 leads to an accumulated MoSi$_x$ 40 having a small specific resistance, which is generally not suitable as a resistance material. Molybdenum silicide having a value of x of over 3.3 is poor in oxidation resistance and low in processability and ease of handling. The MoSi$_x$ film 40 has a thickness preferably within a range of from 5 to 100 nm, or more preferably, from 20 to 60 nm. This deposited film thickness is determined in consideration of the resistance value of the resistance element 16 and the pattern size. A thickness smaller than 5 nm leads not only to difficulty in uniformly forming a film, but also to a risk of removing the film, together with the insulating film, upon etching the insulating film, resulting in the undesirable occurrence of holes. In view of ease of processing, the thickness should preferably be at least 20 nm. A thickness of over 100 nm generally leads to sheet resistivity of up to 100 Ω/□, suggesting unsuitability for use as a resistance element. Particularly with a thickness smaller than 60 nm, it is possible to easily form a resistance element having a desired resistance value.

In this example, molybdenum silicide having a composition ratio of Mo to Si of 1:2.3, i.e., x=2.3 was used as a target, and an $MoSi_x$ film 40 having a thickness of 40 nm was formed by DC magnetron sputtering in an argon atmosphere of $8 \times 10^{-3}$ Torr, with a sputtering power density of 2.8 $W/cm^2$ and a film growth rate of 400 nm/min. The $MoSi_x$ film had a specific resistance of about 1 mΩ.cm, and a sheet resistivity of bout 240 Ω/□.

Figure 4A:
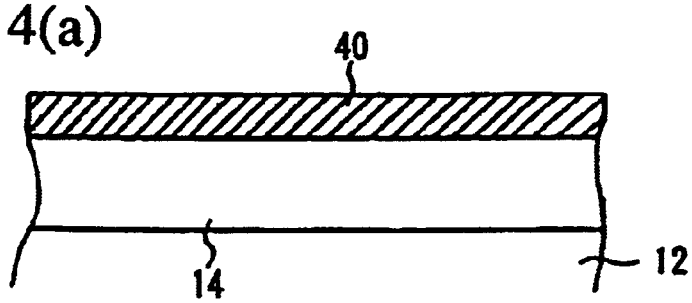
FIG. 4 is a process diagram illustrating a manufacturing method of a semiconductor device according to a third embodiment of the invention.
Figure 4B:
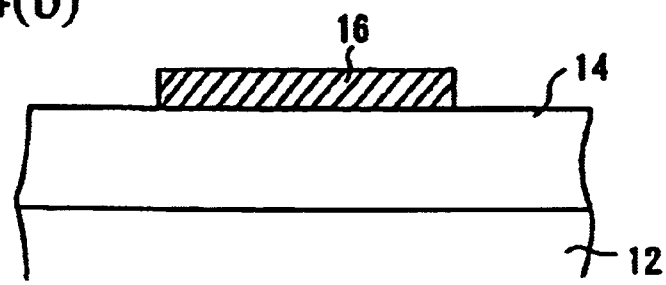
Figure 4C:
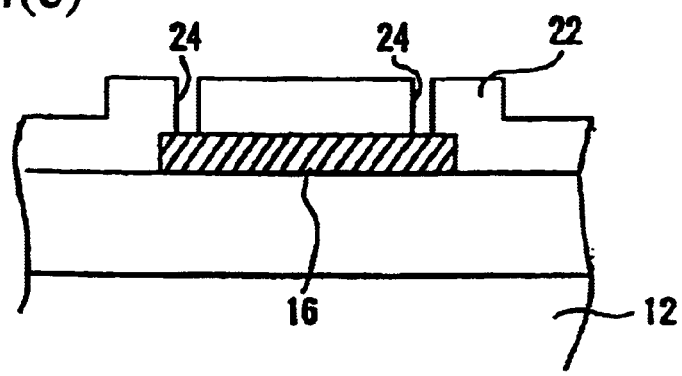
Figure 4D:
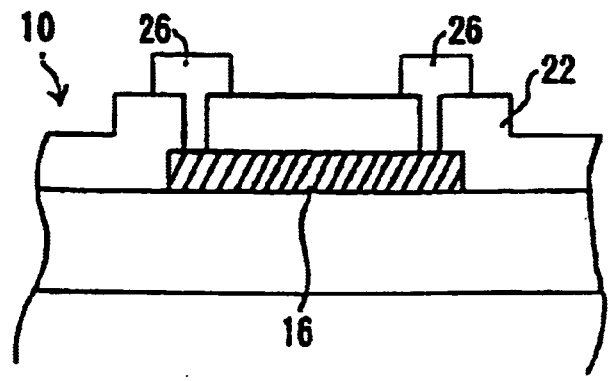

After thus forming the $MoSi_x$ film 40, the portion for the resistance element is covered with a photoresist, and the resistance element 16 is formed by removing the $MoSi_x$ film 40 from the portion other than that for the resistance element (FIG. 4(b)). Then, as shown in FIG. 4(c), an insulating film 22 comprising, for example, a silicon oxide film, may be formed on the surface of a semiconductor substrate 12 by a CVD process or the like into a thickness preferably within a range of from 200 to 400 nm, and a plurality of through-holes 24 are pierced on the land portion of the resistance element 16 by etching. Then, a metallic film comprising Al or an Al alloy (for example, an Al—Cu alloy or an Al—Si—Cu alloy) or a combination of a barrier metal such as Ti, TiN or TiW and Al or an Al alloy may be deposited by ordinary sputtering into a thickness of preferably about 500 nm so as to cover the insulating film 22. Then, after forming a photoresist film on a portion for wiring by the photolithography process, the metallic film on a portion other than that for wiring may be removed by a dry etching process using a chlorine (Cl)-based gas, or by a wet etching process using an etchant mainly comprising phosphoric acid such as a mixture of phosphoric acid, nitric acid, acetic acid and water, and as shown in FIG. 4(d), a wiring 26 is formed to complete a semiconductor device 10.

The manufacturing process shown in FIG. 4 has been described for a semiconductor device 10 having a resistance element, but it is applicable also for a semiconductor device 30 having a fuse element 32. The resistance element 16 and the fuse element 32 may be formed in the same step. By forming the resistance element 16 and the fuse element 32 in a same step, it is possible to simplify steps and reduce the cost.

FIG. 5 illustrates a fourth embodiment of the invention, and is a process diagram of a manufacturing method of a semiconductor device having a resistance element comprising TiN containing oxygen.

Figure 5A:
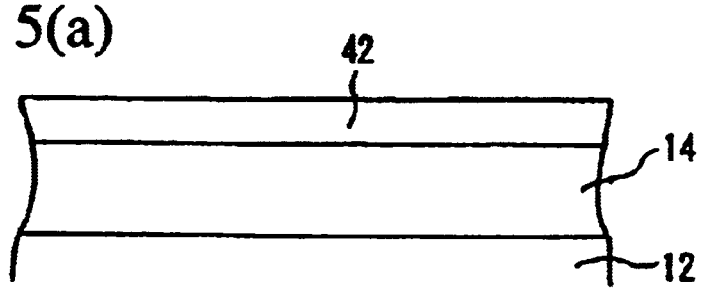
FIG. 5 is a process diagram illustrating a manufacturing method of a semiconductor device according to a fourth embodiment of the invention.
Figure 5B:
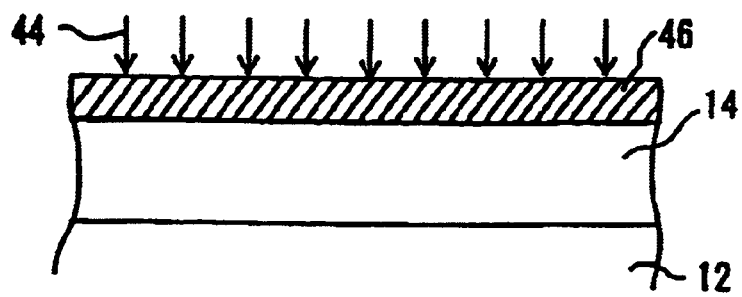
Figure 5C:
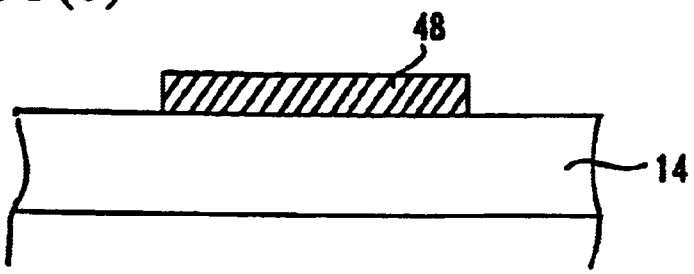
Figure 5D:
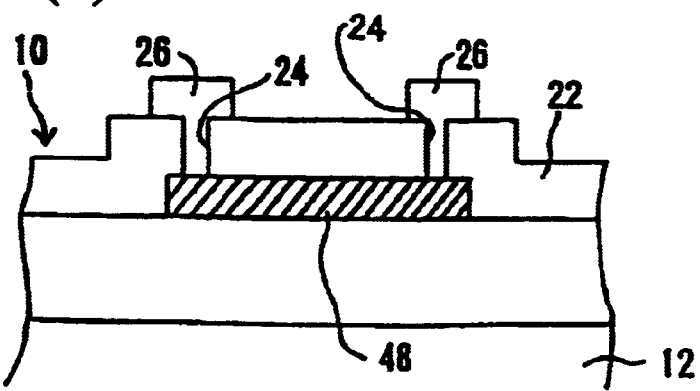

First, as shown in FIG. 5(a), an insulating layer 14 is formed on a semiconductor substrate 12 in the same manner as above. Then, a titanium nitride (TiN) film 42 is formed so as to cover the surface of the insulating layer 14. The TiN film 42 is deposited by, for example, mixing nitrogen gas which is an active gas in a flow rate ratio of 60% into argon, and applying reactive sputtering with titanium (Ti) at 180° C. and $6 \times 10^{-3}$ Torr into a thickness within a range of from 5 to 100 nm. Then, as shown in FIG. 5(b), the semiconductor substrate 12 having the TiN film 42 formed thereon is arranged under a vacuum within a range of from $1 \times 10^{-5}$ to $5 \times 10^{-4}$ Torr, and a titanium nitride film containing oxygen atoms 46 is formed by irradiating an oxygen ion beam of an acceleration energy of 30 keV to the TiN film 42, and injecting oxygen ions in an amount within a range of from about $1 \times 10^{15}$ to $1 \times 10^{16}$ $cm^2$. Then, a photoresist film is formed on a portion for resistance element. The titanium nitride containing oxygen atoms film 46 on a portion other than that for the resistance element is removed by dry etching, thereby forming a resistance element 48 comprising titanium nitride containing oxygen atoms (FIG. 5 (c)). Subsequently, a semiconductor device 10 having a titanium nitride containing oxygen atoms resistance element 48 is obtained through steps similar to those shown in FIGS. 4(c) and (d) (FIG. 5(d)).

For the resistance element 48 comprising titanium nitride containing oxygen atoms formed as above, specific resistance and sheet resistivity can be changed by modifying the amount of oxygen ion injection. It is also possible to form a resistance element having a prescribed resistance value in a prescribed pattern size, and thus to downsize the resistance element. That is, as shown in FIG. 6, specific resistance can be largely improved, and a resistance element having a high sheet resistivity is available by injecting oxygen atoms into the TiN film.

Figure 6:
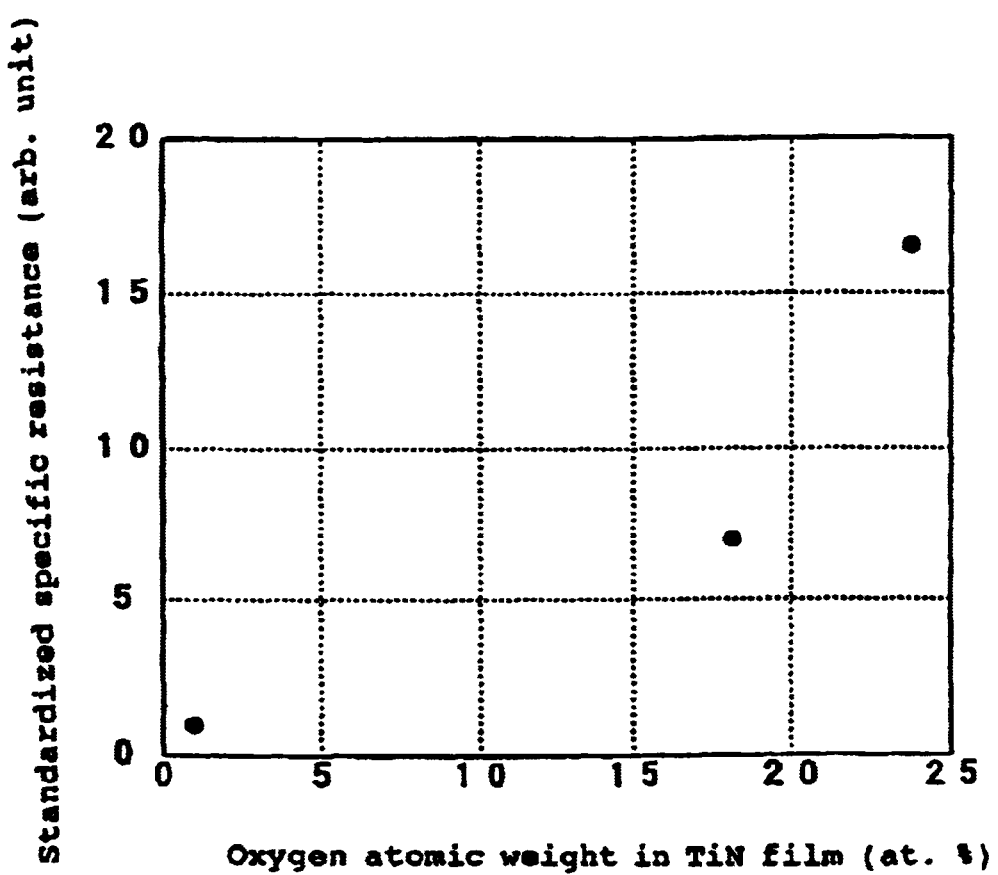
FIG. 6 illustrates the relationship between the amount of oxygen atoms in the titanium nitride film and specific resistance of the titanium nitride film.

FIG. 6 illustrates the relationship between the amount of oxygen atoms in the TiN film and specific resistance of the TiN film: the abscissa represents the amount of oxygen atoms in the TiN film in atomic %, and the ordinate represents specific resistance of the TiN film. Standardization is made with specific resistance of a TiN film not containing oxygen atoms as 1.

In the fourth embodiment, it is also possible to achieve a semiconductor device having a fuse element comprising titanium nitride containing oxygen atoms in place of the resistance element 48, or a semiconductor device having a resistance element and a fuse element formed simultaneously in the same step.

In the above-mentioned embodiment, the description has been based on a case where the film of titanium nitride containing oxygen atoms 46 is formed by ion injection after forming of the TiN film 42. However, the titanium nitride containing oxygen atoms film 46 may be formed through other methods such as, for example, oxidation of the TiN film 42, sputtering with Ti as target in an atmosphere comprising oxygen gas and nitrogen gas, or annealing in an atmosphere comprising oxygen gas and nitrogen gas after forming the Ti film by sputtering.

When oxidizing the TiN film 42 into the titanium nitride containing oxygen atoms film 46, it suffices to carry out an oxidation treatment for 15 to 45 minutes in an oxygen gas atmosphere at a temperature of from 400 to 700° C. When forming the titanium nitride containing oxygen atoms film 46 by active sputtering, it may be achieved by mixing about 5% oxygen gas in flow rate ratio into nitrogen gas, and sputtering under the same conditions as those for the TiN film 42 described as to the fourth embodiment. When annealing the Ti film into the titanium nitride containing oxygen atoms film 46, it suffices to carry out a treatment for 15 to 45 minutes in an atmosphere comprising 97% nitrogen gas an 3% oxygen gas at a temperature of from 400 to 700° C.

FIG. 7 is a process diagram of a manufacturing method of a fifth embodiment of the invention. As shown in FIG. 7(a), an insulating layer 14 is formed on the entire surface of a semiconductor substrate 12, and an MoSi$_x$ film 50 for forming a gate electrode is then deposited by sputtering into a thickness of from 200 to 300 nm. The insulating film 14 may be any insulating film. In this embodiment, for example, it is a gate insulating film or an element separating film such as LOCOS. The gate electrode is not limited to an MoSi$_2$, but may be a polysilicon gate or a polysilicon wiring made by introducing phosphorus. In this case, an electrode is formed, by the CVD process, by depositing polysilicon into a thickness of from 200 to 500 nm, and diffusing phosphorus in a POCl$_3$ atmosphere.

Figure 7A:
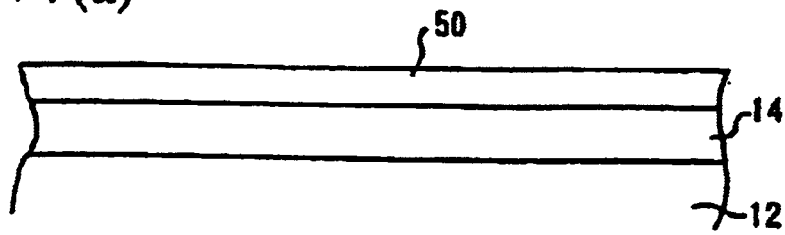
FIG. 7 is a process diagram illustrating a manufacturing method according to a fifth embodiment of the invention.
Figure 7B:
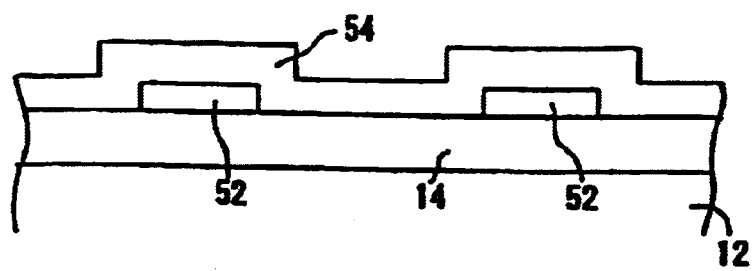

Then, after forming a photoresist film at a portion for the gate electrode, the MoSi$_x$ film 50 at a portion other then for the gate electrode may be removed by dry etching to form a plurality of agate electrodes (FIG. 7(b)). Then, a first insulating film 54 comprising a silicon oxide film or the like is deposited into a thickness of about 400 nm over the entire surface of the semiconductor substrate 12.

Figure 7C:
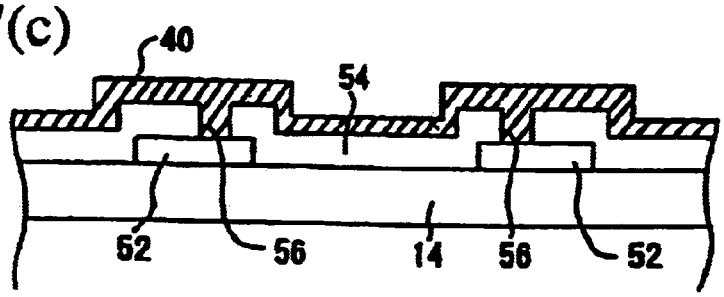
Figure 7D:
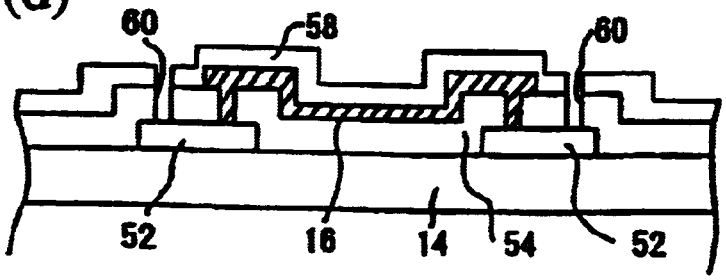
Figure 7E:
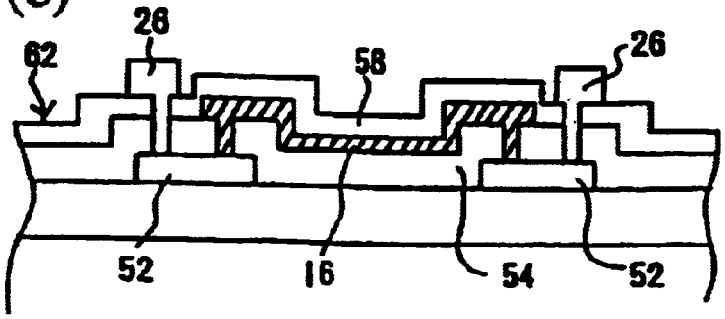
Figure 8A:
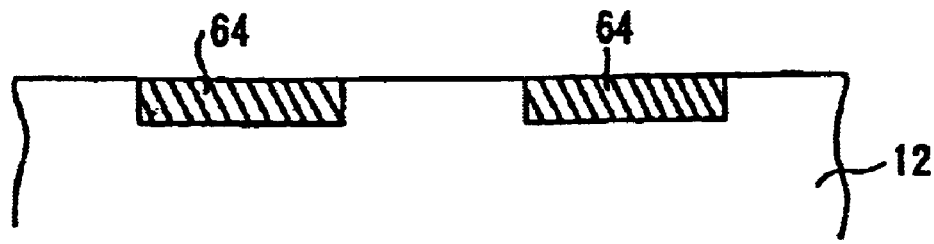
FIG. 8 is a partial process diagram of a manufacturing method according to a sixth embodiment of the invention.
Figure 8B:
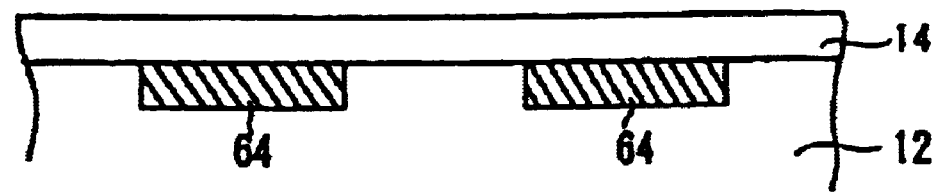
Figure 8C:
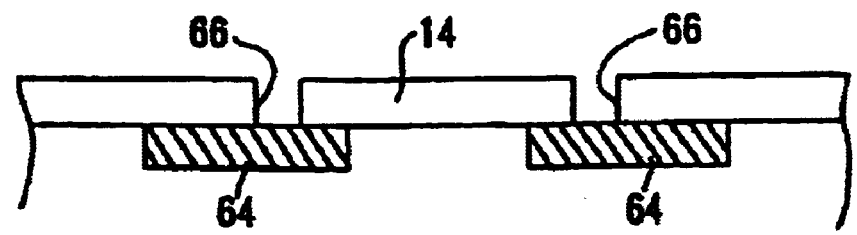
Figure 8D:
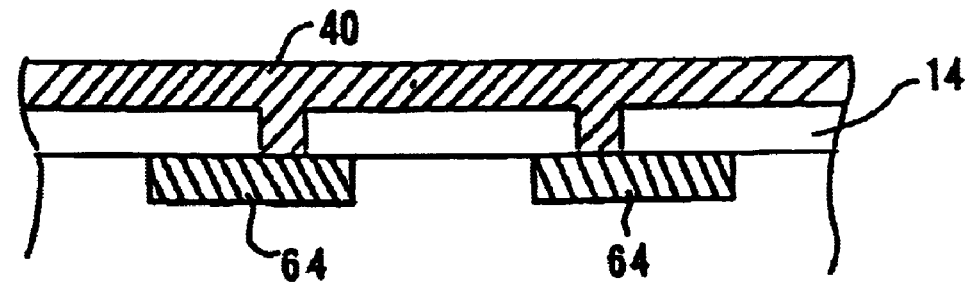

Then, as shown in FIG. 7(c), a first through-hole 56 is formed in the first insulating film 54 located above each of a pair of gate electrode 52, and then, an MoSi$_x$ film 40 is deposited into a thickness of from 5 to 100 nm for forming a resistance element so as to cover the entire first insulating film 54. Subsequently, the MoSi$_x$ film 40 is etched in the same manner as above, and as shown in FIG. 7(d), a resistance element 16 comprising MoSi$_x$ is formed so as to extend over the pair of gate electrodes 52 and to be electrically connected to the gate electrodes 52. Then, a second insulating film 58 comprising a silicon oxide film or the like is preferably formed into a thickness of from 100 to 300 nm over the entire surface of the substrate. Then, a second through-hole 60 is formed so as to pass through the first insulating film 54 and the second insulating film 58 located above the gate electrodes 52 connected to each resistance element 16. Then, a conductive film comprising Al or an Al alloy (for example, an Al—Cu alloy or an Al—Si—Cu alloy), or a combination of a barrier metal such as Ti, TiN or TiW with Al or an Al alloy is formed over the entire surface of the second insulating film 58. Then, an electrode 26 for the resistance element, electrically connected to the gate electrodes 52, may be formed by dry etching in the same manner as above, to complete a semiconductor device 62 having an MoSi$_x$ resistance element 16.

In this embodiment also, a resistance element comprising titanium nitride containing oxygen atoms may be formed in place of MoSi$_x$, or a fuse element may comprise MoSi$_x$ or titanium nitride atoms containing oxygen atoms. The above embodiment has covered the case where gate electrodes 52 are formed. A resistance element or a fuse element may however be formed so as to extend over undercoat wires by forming the undercoat wires comprising Al or an Al alloy (for example, an Al—Cu alloy or an Al—Si—Cu alloy) or a combination of a barrier metal such as Ti, TiN or TiW with Al or an Al alloy, in place of the gate electrodes 52.

FIGS. 8 and 9 are process diagrams of a manufacturing method of a semiconductor device of a sixth embodiment. In this embodiment, first as shown in FIG. 8(a), ions of a V-family element such as phosphorus (P) or arsenic (As) or ions of a III-family element such as boron (B) in a prescribed amount are injected into a prescribed position of a semiconductor substrate 12 comprising silicon or the like, thereby forming a plurality of diffusion layer regions 64 each comprising an n-type conductive layer or a p-type conductive layer. Then, as shown in FIG. 8(b), an insulating layer 14 comprising a silicon oxide film or the like is deposited into a prescribed thickness (for example, 400 nm) over the entire surface of the semiconductor substrate 12. Then, as shown in FIG. 8(c), a first through-hole 66 is formed by etching in the insulating layer 14 on the diffusion layer, and then, MoSi$_x$ is preferably deposited to a thickness of from 5 to 100 nm so as to cover the entire surface of the insulating layer 14 and the first through-hole 66 by sputtering, thereby forming an MoSi$_x$ film 40 (FIG. 8(d)).

Figure 9E:
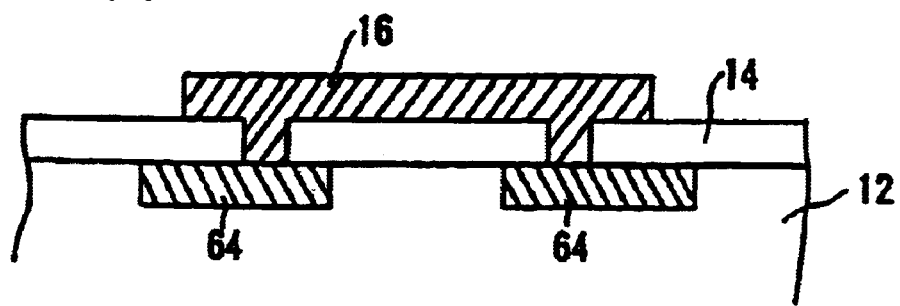
FIG. 9 is a partial process diagram of the manufacturing method according to the sixth embodiment of the invention, illustrating the process following that shown in FIG. 8.
Figure 9F:
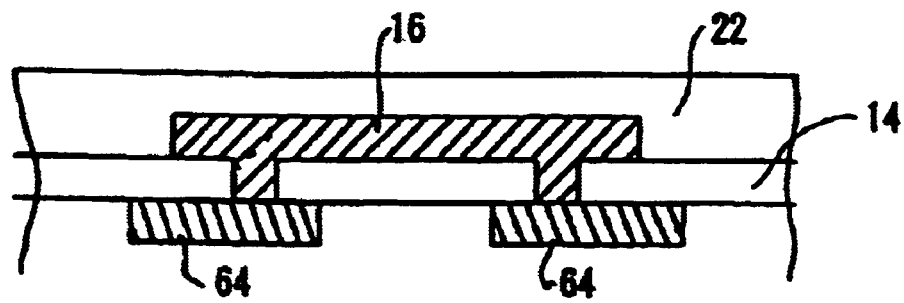
Figure 9G:
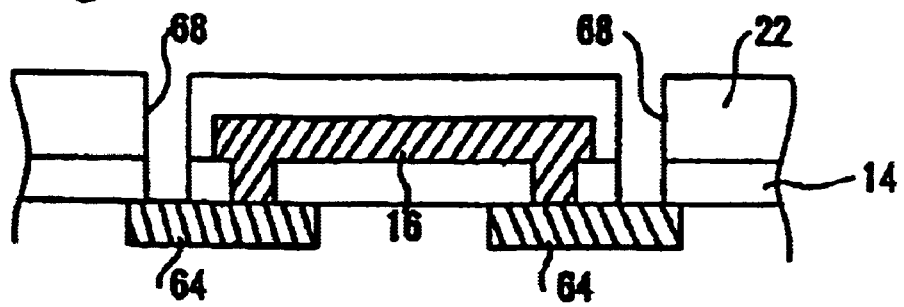
Figure 9H:
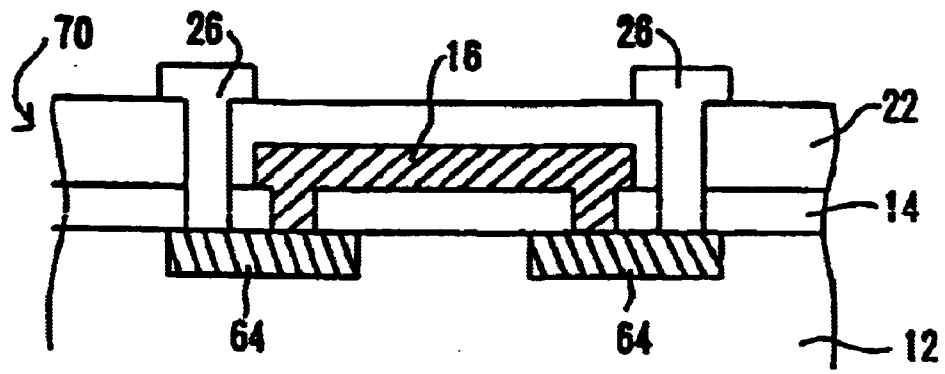

Then, as shown in FIG. 9(e), a resistance element 16 comprising MoSi$_x$ electrically connected to a pair of diffusion layer regions 64 is formed in the same manner as above. Then, after forming an insulating film 22 comprising a silicon oxide film or the like so as to cover the entire surface of the semiconductor substrate 12 on the insulating layer 14, a second through-hole 68 is formed so as to pass through the insulating layer 14 and the insulating film 22 on the diffusion layer region 64 (FIGS. 9(f) and (g)). Subsequently, a metal film comprising Al or an Al alloy (for example, an Al—Cu alloy or an Al—Si—Cu alloy) or a combination of a barrier metal such as Ti, TiN or TiW with Al or an Al alloy is formed over the entire surface of the insulating film and in the second through-hole 68. An electrode 26 for the resistance element electrically connected to the diffusion layer 64 is formed in the same manner as above, thereby completing a semiconductor device 70 having a resistance element 16 comprising MoSi$_x$.

In this embodiment also, a fuse element may be formed in place of the resistance element 16, or the resistance element or the fuse element may be formed of titanium nitride containing oxygen atoms in place of MoSi$_x$.

Figure 10:
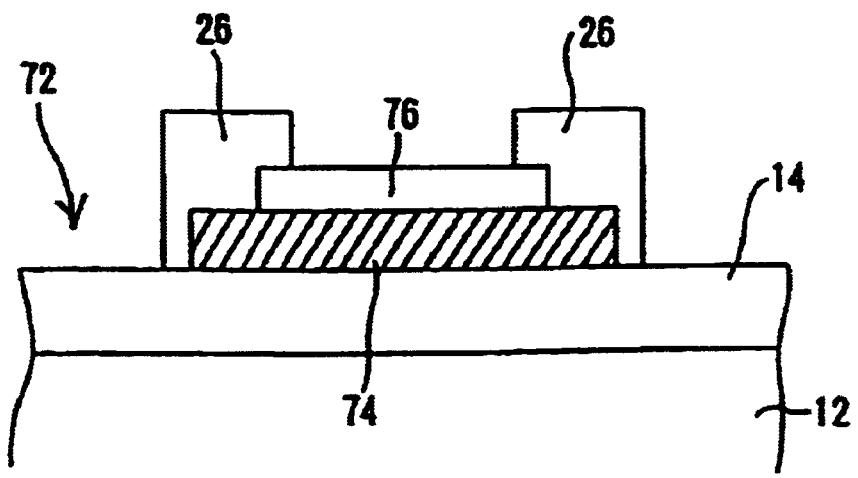
FIG. 10 is a descriptive view illustrating a semiconductor device according to a seventh embodiment of the invention.

FIG. 10 is a descriptive view of a semiconductor device of a seventh embodiment of the invention. This semiconductor device 72 has a resistance element (or a fuse element) 74 comprising MoSi$_x$ or titanium nitride containing oxygen atoms formed on the upper surface of an insulating layer provided on a semiconductor substrate 12. At the both ends of the resistance element (or the fuse element) 74, an electrode 26 of the resistance element (or the fuse element) 74 so as to partially cover the resistance element (or the fuse element) 74 and the end of an insulating film 76 formed thereon. In this embodiment, the electrode 26 can be provided without intervention of the insulating film. Since the insulating film 76 is only to prevent the resistance element (or the fuse element) 74 from being damaged upon forming the electrode 26 by etching, the insulating film 76 may be omitted.

Figure 11:
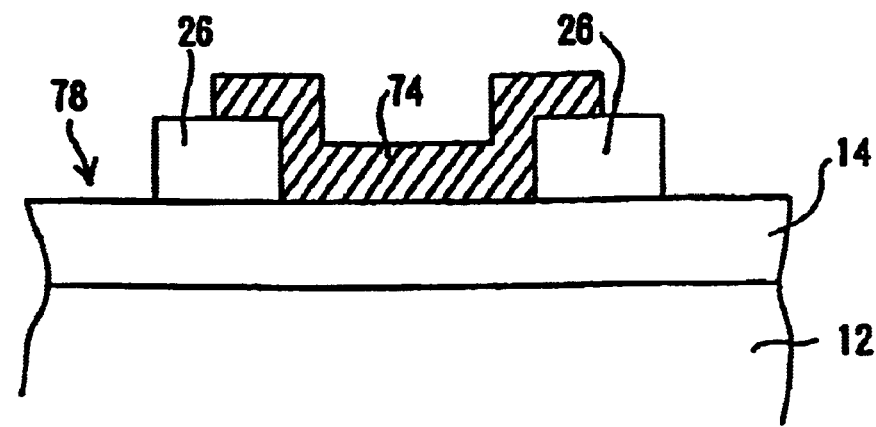
FIG. 11 is a descriptive view illustrating a semiconductor device according to an eighth embodiment of the invention.

FIG. 11 is a descriptive view of a semiconductor device of an eighth embodiment of the invention. In the semiconductor device 78 shown in FIG. 11, after forming an insulating layer 14, an electrode 26 for a resistance element (or a fuse element) is formed directly on the insulating layer 14. After forming the electrode 26, the resistance element (or the fuse element) 74 comprising MoSi$_x$ or titanium nitride containing oxygen atoms is formed so as to extend over the pair of electrodes 26, so that the electrodes 26 are located below the element 74.

Figure 12:
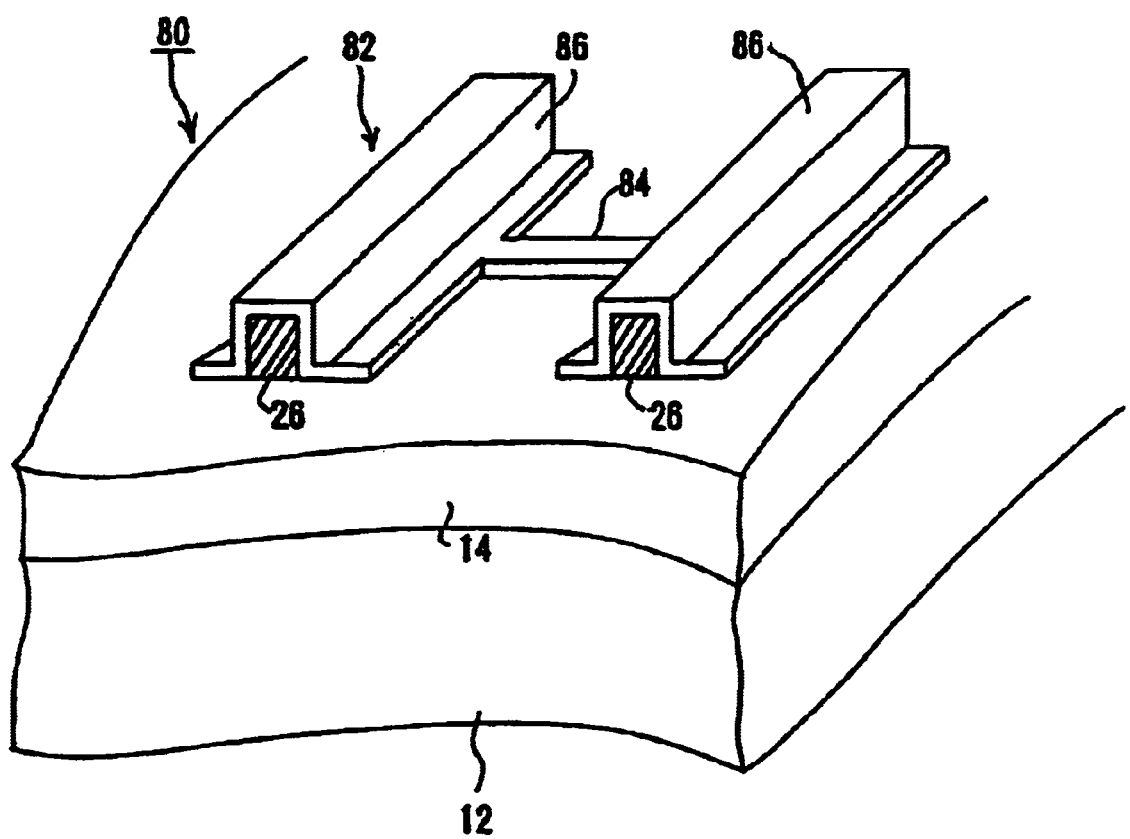
FIG. 12 is a partial perspective view of a semiconductor device according to a ninth embodiment of the invention.

FIG. 12 is a partial perspective view of a semiconductor device of a ninth embodiment of the invention. In the semiconductor device 80 of this embodiment, the electrode 26 comprising Al or an Al alloy (for example, an Al—Cu alloy or an Al—Si—Cu alloy) or a combination of a barrier metal such as Ti, TiN or TiW with Al or an Al alloy is formed directly on the upper surface of an insulating layer 14. A resistance element 82 comprising MoSi$_x$ or titanium nitride containing oxygen atoms is formed so that a land portion 86 provided on a resistance element main body 84 covers the upper surface and the side surfaces of the electrode 26. With the thus formed semiconductor device 80, in which the land portion 86 of the resistance element 82 is provided so as to cover the electrode 26, it is possible to improve electromigration resistance or stress migration resistance, and prevent occurrence of lateral cracks.

In this embodiment also, the resistance element 82 can be formed of titanium nitride containing oxygen atoms, and the fuse element having the same shape as the resistance element 82 may be formed of $MoSi_x$ or titanium nitride containing oxygen atoms.

According to certain embodiments of the present invention, it is possible to increase specific resistance, easily form a resistance element having a prescribed resistance value in a desired pattern size, and downsize the resistance element by forming the resistance element with titanium nitride containing oxygen atoms or $MoSi_x$.

In addition, certain embodiments may include a fuse element made of titanium nitride containing oxygen atoms or $MoSi_x$. In these embodiments, a relatively large specific resistance blowout can be accomplished with a small current in a short period of time, thus permitting improvement of fuse functions.

Furthermore, certain embodiments permit the manufacturing process to be simplified and the cost reduced by forming the resistance element and the fuse element with films of the same composition in the same manufacturing step.

It will, of course, be understood that modifications of the present invention, in its various aspects, will be apparent to those skilled in the art. Other embodiments are possible, their specific features depending upon the particular application. Therefore, the scope of the invention should not be limited by the particular embodiments herein described but should be defined by the appended claims and equivalents thereof.

What is claimed is:

1. A semiconductor device comprising integrated active and passive elements, said device including a fuse element, wherein said fuse element comprises titanium nitride containing oxygen atoms.

2. A semiconductor device according to claim 1, wherein said titanium nitride containing oxygen atoms has an oxygen atomic weight within a range of from 5 to 25 atomic %.

3. A semiconductor device as in claim 1, wherein said titanium nitride containing oxygen atoms includes an oxygen atomic weight of no greater than 25 atomic percent.

4. A semiconductor device as in claim 1, wherein said fuse element consists of titanium nitride containing oxygen atoms, wherein the oxygen content is between 5 and 25 atomic percent.

5. A semiconductor device as in claim 2, wherein said fuse element has a thickness within a range of from 5 to 100 nm.

6. A semiconductor device including a fuse element, said fuse element comprising titanium nitride containing oxygen atoms.

7. A semiconductor device according to claim 6, wherein said fuse element has a thickness within a range of from 5 to 100 nm.

8. A semiconductor device according to claim 6, wherein said fuse element has a necking portion.

9. A semiconductor device according to claim 6, further comprising an electrode for said fuse element formed on an upper portion of said fuse element.

10. A semiconductor device according to claim 9, wherein said electrode for said fuse element is connected to said fuse element via a hole formed in an insulating film provided on an upper part of said fuse element.

11. A semiconductor device according to claim 9, wherein said fuse element extends over a pair of structures selected from the group consisting of gate electrodes and undercoat wirings, and said electrode of said fuse element is connected to said structures via a hole formed in an insulating film provided so as to cover said structures.

12. A semiconductor device according to claim 9, wherein said fuse element extends over a pair of diffusion layer regions provided in a semiconductor substrate, and the electrode for said fuse element is connected to said diffusion layer via a hole formed in an insulating film provided so as to cover said diffusion layer.

13. A semiconductor device according to claim 9, further comprising an electrode of said fuse element provided in connection with a lower part of said fuse element.

14. A semiconductor device as in claim 6, wherein said fuse element has a thickness within a range of 20 to 60 nm.

15. A semiconductor device comprising
a first insulating layer;
a fuse element formed in direct contact with an upper surface of said first insulating layer;
said fuse element formed from a material consisting of titanium nitride containing oxygen atoms therein;
a second insulating layer covering at least a portion of said fuse element;
a first electrode extending through a first portion of said second insulating layer and electrically coupled to said fuse element;
a second electrode extending through a second portion of said second insulating layer and electrically coupled to said fuse element; and
wherein said first electrode is spaced apart from said second electrode.

16. A semiconductor device as in claim 15, wherein said second insulating layer is disposed between said first electrode and said second electrode.

17. A semiconductor device as in claim 15, wherein said titanium nitride containing oxygen atoms includes 5 atomic percent to 25 atomic percent oxygen.

18. A semiconductor device comprising:
a first region selected from the group consisting of a gate electrode and a diffusion zone;
a second region selected from the group consisting of a gate electrode and a diffusion zone, said second region spaced apart from said first region;
a first insulating layer disposed between said first region and said second region;
a fuse element extending above at least a portion of said first insulating layer;
said fuse element fabricated from a material comprising titanium nitride containing from 5 atomic percent to 25 atomic percent oxygen, said titanium nitride containing from 5 atomic percent to 25 atomic percent oxygen being in direct contact with said first insulating layer;
a first portion of said fuse element extending through a first opening in said insulating layer and electrically contacting said first region;
a second portion of fuse said element extending through a second opening in said insulating layer and electrically contacting said second region;
a first electrode electrically coupled to said first region at a first position spaced apart from said fuse element; and
a second electrode electrically coupled to said second region at a second position spaced apart from said fuse element.

19. A semiconductor device comprising:
a first insulating layer;
a fuse element formed over said first insulating layer;
said fuse element being formed from a material comprising titanium nitride containing from 5 atomic percent to 25 atomic percent oxygen, said titanium nitride containing from 5 atomic percent to 25 atomic percent oxygen being in direct contact with said first insulating layer;

said fuse element including a first end region and a second end region spaced apart from said first end region;

a first electrode formed over said first end region; and a second electrode formed over said second end region.

20. A semiconductor device comprising an insulating layer;

a first electrode formed on said insulating layer;

a second electrode formed on said insulating layer and spaced apart from said first electrode;

a fuse element formed on said insulating layer and including a first portion covering at least a portion of said first electrode and a second portion covering at least a portion of said second electrode; and said fuse element comprising titanium nitride containing from 5 atomic percent to 25 atomic percent oxygen, said titanium nitride containing from 5 atomic percent to 25 atomic percent oxygen being in direct contact with said insulating layer.

* * * * *